(12) United States Patent
Fukami et al.

(10) Patent No.: US 7,670,918 B2
(45) Date of Patent: Mar. 2, 2010

(54) SEMICONDUCTOR DEVICE HAVING IMPURITY-DOPED RESISTOR ELEMENT

(75) Inventors: Yuko Fukami, Kariya (JP); Ryuichiro Abe, Ichinomiya (JP)

(73) Assignee: DENSO CORPORATION, Kariya (JP)

( * ) Notice: Subject to any disclaimer, the term of this patent is extended or adjusted under 35 U.S.C. 154(b) by 73 days.

(21) Appl. No.: 12/007,720

(22) Filed: Jan. 15, 2008

(65) Prior Publication Data

US 2008/0188027 A1 Aug. 7, 2008

(30) Foreign Application Priority Data

Feb. 5, 2007 (JP) ............................. 2007-025940

(51) Int. Cl.
*H01L 21/20* (2006.01)
(52) U.S. Cl. .................... 438/382; 438/54; 438/59; 438/149; 438/150; 438/300; 257/516; 257/528; 257/538
(58) Field of Classification Search ................. 257/484
See application file for complete search history.

(56) References Cited

U.S. PATENT DOCUMENTS

| 4,685,331 | A | 8/1987 | Renken et al. | |
|---|---|---|---|---|
| 4,967,248 | A * | 10/1990 | Shimizu | ............ 257/304 |
| 6,353,262 | B1 | 3/2002 | Honda | |
| 6,475,821 | B2 | 11/2002 | Honda | |
| 6,490,915 | B2 * | 12/2002 | Yamada et al. | ......... 73/114.34 |
| 6,923,053 | B2 | 8/2005 | Yamada et al. | |
| 6,983,653 | B2 | 1/2006 | Iwaki et al. | |
| 7,181,962 | B2 * | 2/2007 | Yamada et al. | ............ 73/204.26 |
| 7,228,614 | B2 | 6/2007 | Yamada et al. | |
| 2002/0110952 | A1 * | 8/2002 | Gris | .......................... 438/106 |
| 2003/0183000 | A1 | 10/2003 | Yamada et al. | |

FOREIGN PATENT DOCUMENTS

| JP | A-2001-012985 | 1/2001 |
|---|---|---|
| JP | A-2003-337056 | 11/2003 |
| JP | A-2004-219080 | 8/2004 |
| JP | A-2004-241398 | 8/2004 |
| JP | A-2005-3468 | 1/2005 |

OTHER PUBLICATIONS

Notice of Reasons for Rejection mailed on Mar. 17, 2009 issued from the Japanese Patent Office in the corresponding Japanese patent application No. 2007-025940 (and excerpt English translation).

* cited by examiner

*Primary Examiner*—N Drew Richards
*Assistant Examiner*—Kyoung Lee
(74) *Attorney, Agent, or Firm*—Posz Law Group, PLC

(57) ABSTRACT

Resistor elements are formed by doping impurity into a single crystal film formed on a substrate such as a silicon-on-insulator substrate. A semiconductor device having such resistor elements is used as a detector for detecting an amount of airflow, for example. The impurity density in the single crystal silicon is made lower than $1 \times 10^{20}/cm^3$ to suppress a resistance change by aging especially at a temperature higher than 310° C. To obtain a high temperature coefficient of the resistor element as well as a low resistance change by aging, the impurity density is set in a range from $4 \times 10^{19}/cm^3$ to $1 \times 10^{20}/cm^3$, and more preferably in a range from $7 \times 10^{19}/cm^3$ to $1 \times 10^{20}/cm^3$. As the impurity, N-type impurity such as phosphorus or P-type impurity such as boron may be used. It is preferable to use the impurity having a low diffusion coefficient to attain a low resistance change by aging.

11 Claims, 5 Drawing Sheets

SEMICONDUCTOR DEVICE HAVING IMPURITY-DOPED RESISTOR ELEMENT

CROSS-REFERENCE TO RELATED APPLICATION

This application is based upon and claims benefit of priority of Japanese Patent Application No. 2007-25940 filed on Feb. 5, 2007, the content of which is incorporated herein by reference.

BACKGROUND OF THE INVENTION

1. Field of the Invention

The present invention relates to a semiconductor device including a resistor element doped with impurity.

2. Description of Related Art

A thermal type flow sensor for detecting a flow amount of fluid has been known hitherto. This type of flow sensor includes a heater element and a temperature-sensitive element, both made by doping impurity into silicon semi-conductor layer. Examples of this type of sensor are shown in Japanese Patents No. 3468731 and No. 3698679. In this sensor device, a heater element and a temperature-sensitive element are made by doping impurity into a semiconductor layer. Both of the heater element and the temperature-sensitive element are resistor elements, and the specific resistance thereof is made $8 \times 10^{-4}$ $\Omega$cm or lower, and an impurity density is made $2 \times 10^{20}/cm^3$ or higher. In another example shown in JP-A-2004-205498, the impurity density in the resistor element made by doping the impurity into a semiconductor layer is set to $1 \times 10^{20}/cm^3$ or higher.

Tests conducted by inventors of the present invention revealed the fact that a resistance change by aging in the resistor having a high impurity density is high when the resistor is at a high temperature, e.g., a temperature higher than 310° C.

SUMMARY OF THE INVENTION

The present invention has been made in view of the above-mentioned problem, and an object of the present invention is to provide an improved semiconductor device having a resistor made by doping impurity into a semiconductor layer, in which the resistance change by aging is suppressed in a wide temperature range.

The semiconductor device according to the present invention is manufactured in the following process. A substrate such as a Silicon On Insulator (SOI) is prepared. A single crystal silicon film is formed on the substrate, and then impurity such as phosphorus is doped into the single crystal silicon film. The impurity density in the single crystal silicon film is made lower than $1 \times 10^{20}/cm^3$. Then, resistor elements are formed by removing unnecessary portions by etching or the like.

The semiconductor device thus manufactured may be used as a detector for detecting an amount of fluid flow such as an airflow. In this case, one part of the resistor elements are used as temperature-sensitive elements for detecting temperature and the other part of the resistor elements are used as heater elements for maintaining temperature around the temperature-sensitive elements.

The impurity density is made lower than $1 \times 10^{20}/cm^3$ to suppress an amount of resistance change by aging especially at a high temperature exceeding 310° C. Since the resistance change by aging is mostly caused by diffusion of the impurity, the resistance change can be suppressed by limiting the impurity density. As the impurity, N-type impurity such as phosphorus or P-type impurity such as boron is used. It is preferable to select such an impurity element that has a lower diffusion coefficient to suppress the resistance change by aging.

To improve sensitivity of the temperature-sensitive elements, it is desirable to use the resistor elements having a high temperature coefficient. For this purpose, a lower limit of the impurity density may be set to a level of $4 \times 10^{19}/cm^3$. Considering both factors, i.e., suppressing the resistance change by aging and obtaining the high temperature coefficient, the impurity density is set in a range from $4 \times 10^{19}/cm^3$ to $1 \times 10^{20}/cm^3$. Most preferably, the impurity density is set in a range $7 \times 10^{19}/cm^3$ to $1 \times 10^{20}/cm^3$ in which the temperature coefficient is substantially constant.

According to the present invention, the resistance change by aging in the resistor formed by doping impurity into the single crystal silicon film, especially at a high temperature, is suppressed while obtaining a high temperature coefficient at the same time. Other objects and features of the present invention will become more readily apparent from a better understanding of the preferred embodiments described below with reference to the following drawings.

DETAILED DESCRIPTION OF THE PREFERRED EMBODIMENTS

Figure 1:
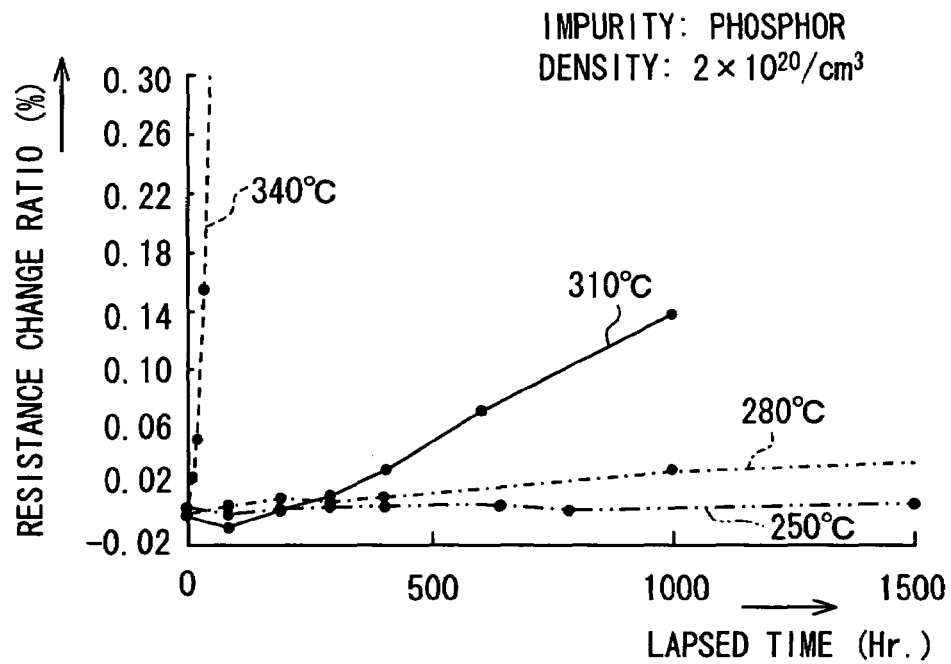
FIG. 1 is a graph showing a relation between lapsed time at various temperatures and a resistance change ratio in a resistor made by doping impurity into a semiconductor layer.

First, referring to FIG. 1, tests conducted by the inventors will be explained. A resistor is formed by doping phosphorus (referred to as impurity or dopant) into single crystal silicon. The density of the impurity is set to $2 \times 10^{20}/cm^3$. The resistor is placed at various temperatures, 250° C.-340° C., and its resistance change ratio (in %) is measured. As seen in the graph, when the temperature is higher than 310° C., the resistance change ratio becomes higher according to lapsed time. This means that the resistance of the doped resistor changes at a higher rate when the temperature is high.

On the other hand, it is known that an activation energy in re-diffusion of phosphorus is 3 eV. An activation energy of resistance changes by aging was about 3 eV according to experiments conducted by the inventors of the present invention. In the experiments, a resistor having a phosphorus density of $2 \times 10^{20}/cm^3$ is tested. This means that the inventors found out the following fact: A main factor causing the resistance change in the resistor made by doping impurity into single crystal silicon under a high temperature resides in re-diffusion of the impurity. The present invention is made based on this finding.

Figure 2:
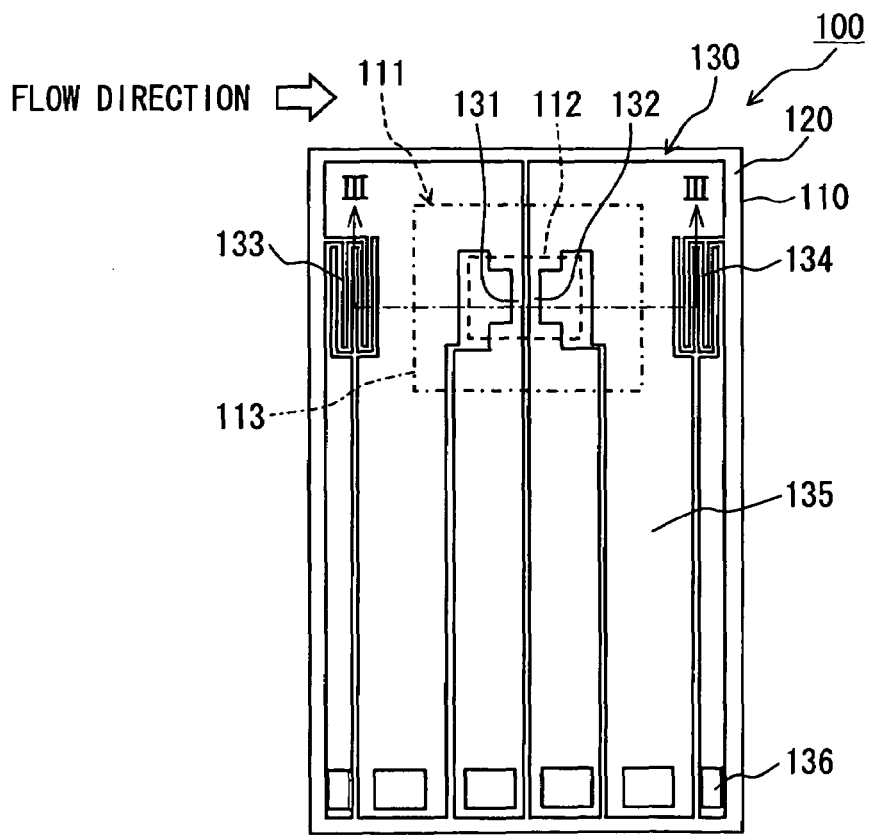
FIG. 2 is a plan view showing a semiconductor device according to the present invention as a first embodiment.
Figure 3:
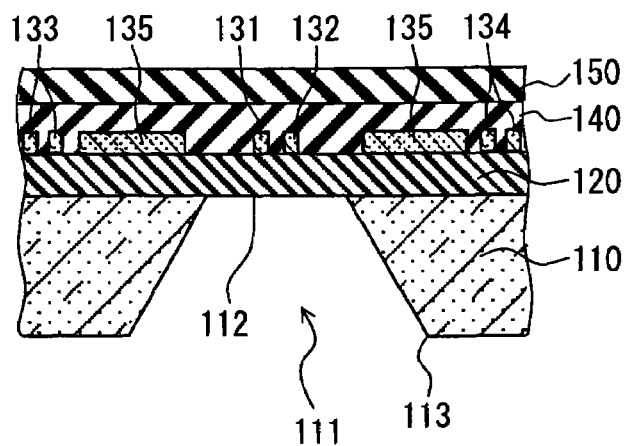
FIG. 3 is a partial cross-sectional view showing the semiconductor device, taken along line III-III shown in FIG. 2.

A first embodiment of the present invention will be described with reference to FIGS. 2-8. An upper side in FIG. 3 is referred to as an upper side of a semiconductor device 100 only for convenience of explanation. In the first embodiment, the present invention is applied to a semiconductor device for detecting an amount of fluid flow (a flow sensor). The flow sensor is disposed in an intake pipe, for example, of an internal combustion engine for an automotive vehicle. In FIG. 2, an arrow shows a direction of the fluid flow.

As shown in FIGS. 2 and 3, the semiconductor device 100 includes a detector 130 for detecting an amount of fluid flow, the detector 130 being formed on a semiconductor substrate 110 with an insulating layer 120 interposed therebetween. The detector 130 includes heater elements 131, 132, and temperature-sensitive elements 133, 134. The semiconductor substrate 110 is a silicon substrate. The substrate 110 has a cavity 111 formed at a bottom side of the substrate. As shown in FIG. 3, the cavity 111 has a square bottom opening 113 and an upper end which ends up with a bottom surface 112 of an insulating layer 120 formed on the substrate. The cavity 111 is the largest at the bottom end and the narrowest at the upper end.

On the silicon substrate 110, an insulating layer 120 is formed with silicon-oxides. Because of the cavity 111, the semiconductor device 100 has a thin membrane portion on which the heater elements 131, 132 are formed. The membrane portion has a heat capacity lower than other portions of the semiconductor device. A pair of temperature-sensitive elements 133, 134 are formed on the insulating layer 120 at both sides of the heater elements 131, 132. The temperature-sensitive elements are positioned on a thick portion located at both sides of the thin portion. One temperature-sensitive element 133 positioned at an upstream portion of the fluid flow is referred to as an upstream temperature-sensitive element, and the other temperature-sensitive element 134 positioned at an downstream portion of the fluid flow is referred to as a downstream temperature-sensitive element. The heater elements 131, 132 and the temperature-sensitive elements 133, 134 are electrically connected by connecting portions 135 which are connected to pads 136. The pads 136 are electrically connected to a circuit for processing signals from the semiconductor device 100.

The heater elements 131, 132, the temperature-sensitive elements 133, 134, and the connecting portions 135 are made by doping impurity into the single crystal silicon layer in the manner explained later in detail. An insulating layer 140 covering those components is formed with silicon oxides. A protecting layer 150 covering the insulating layer 140 is formed with silicon nitride.

The heater elements 131, 132 generate heat according to electric current supplied thereto. In addition, the heater elements detect temperature based on changes in their own resistances. An amount of fluid flow is detected based on an amount of heat dissipated from the heater elements 131, 132. In addition, a direction of the fluid flow is detected based on an amount of heat dissipated from each of the heater elements 131, 132. An amount of electric current supplied to each of the heater elements 131, 132 is controlled based on a temperature difference between the upstream heater element 131 and the upstream temperature-sensitive element 133 and a temperature difference between the downstream heater element 132 and the downstream temperature-sensitive element 134.

Details of the function of the detector 130 are disclosed in JP-A-2004-205498 and JP-A-2004-241398.

Now, the density of the impurity (dopant) doped into the single crystal silicon to form the heater elements 131, 132, the temperature-sensitive elements 133, 134 and the connecting portions 135 will be described in detail with reference to FIGS. 4-6.

Figure 4:
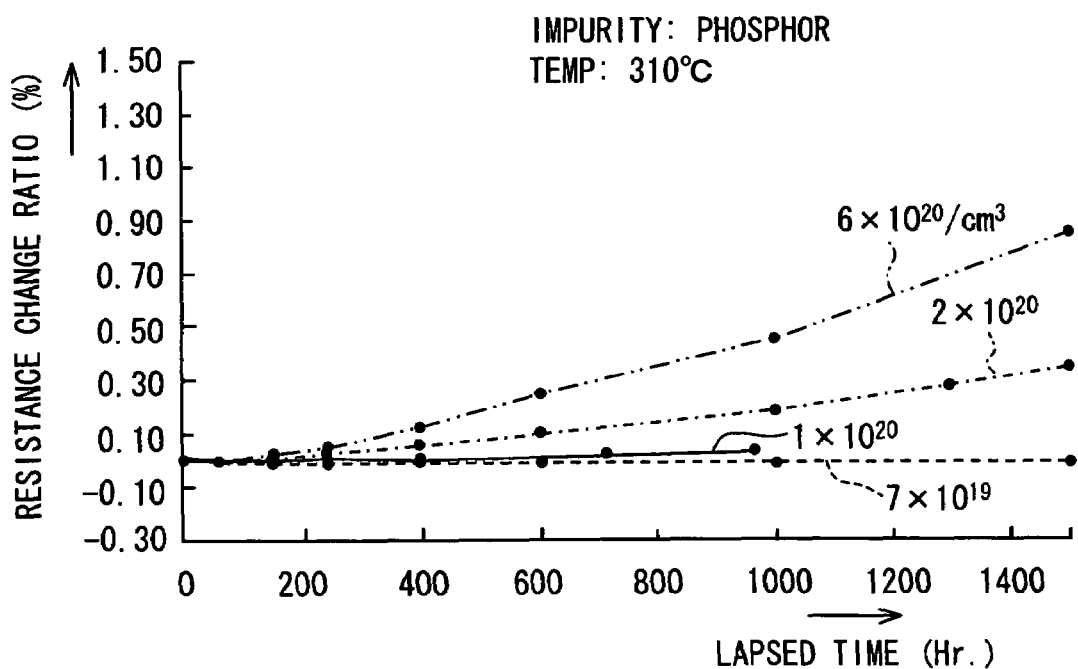
FIG. 4 is a graph showing a resistance change ratio in the resistor relative to lapsed time at 310° C.

FIG. 4 shows a relation between a test time (time lapsed at 310° C.) and a resistance change ratio (in percent) in the resistor formed by doping impurity into single crystal silicon layer. Various samples of the resistor are formed by doping different amounts of phosphorus to thereby realize different impurity density in the resistors, i.e., from $7 \times 10^{19}/cm^3$ to $6 \times 10^{20}/cm^3$. Respective lines in the graph show the resistance change ratio (%) of the resistor samples having following impurity densities: line (1) $7 \times 10^{19}/cm^3$; line (2) $1 \times 10^{20}/cm^3$; line (3) $2 \times 10^{20}/cm^3$; and line (4) $6 \times 10^{20}/cm^3$.

Figure 5:
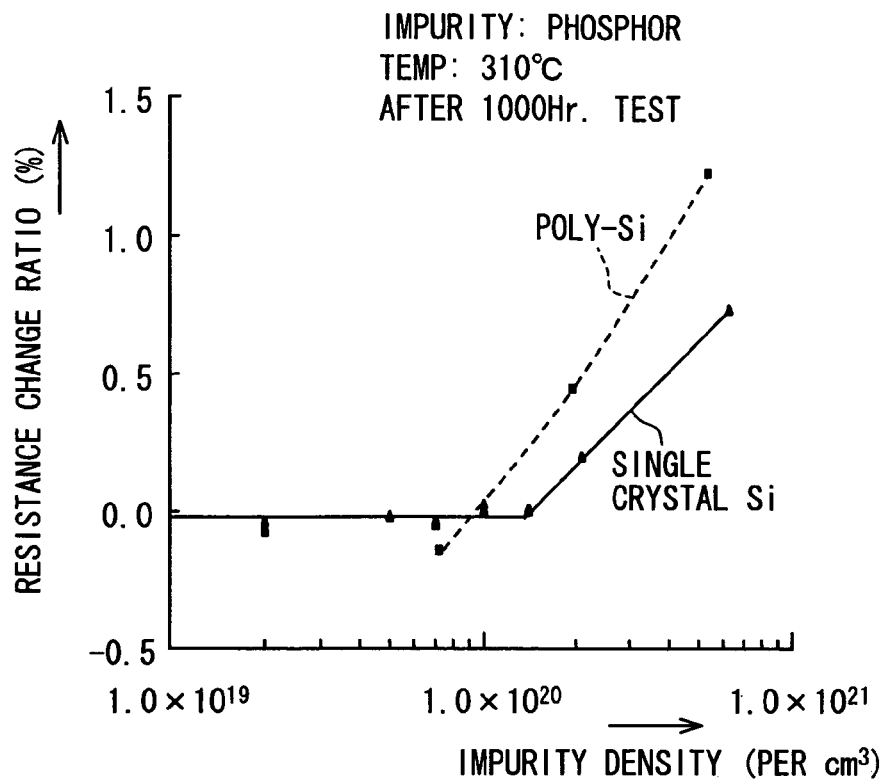
FIG. 5 is a graph showing a resistance change ratio in the resistor relative to an impurity density in the resistor.

FIG. 5 shows a relation between the resistance change ratio (%) and the impurity density. Resistor samples are made by doping different amounts of phosphorus into single crystal silicon or poly-silicon. The resistor samples thus made are kept at 310° C. for 1,000 hours, and then the resistance change ratios of the respective samples are measured. A solid line shows the test results of the resistor samples made from the single crystal silicon and a dotted line shows those of the resistor samples made from poly-silicon.

Figure 6:
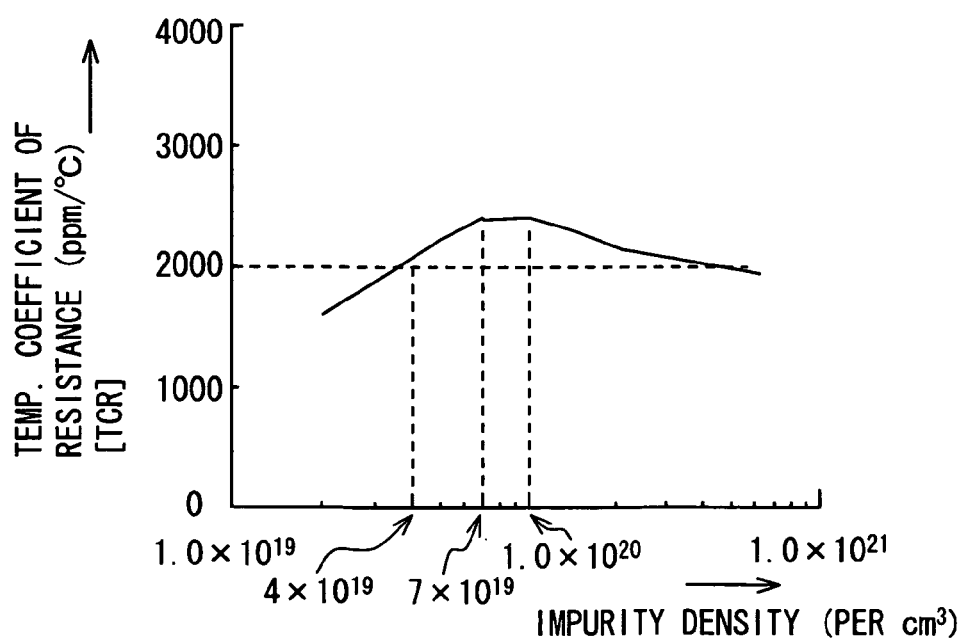
FIG. 6 is a graph showing a temperature coefficient of resistance in the resistor relative to an impurity density in the resistor.

FIG. 6 shows a temperature coefficient of resistor samples formed by doping with different amounts of phosphorus. The amount of phosphorus doped into single crystal silicon is changed from $1.0 \times 10^{19}/cm^3$ to $1.0 \times 10^{21}/cm^3$.

As shown in FIG. 4, the resistance change ratio of the resistor samples becomes higher as the impurity density becomes higher when the resistor samples are kept at a high temperature such as 310° C. This phenomenon may be explained as follows: It is found out by the inventors that a main factor causing resistance change in the resistor formed by doping impurity into a single crystal silicon at a high temperature is a re-diffusion of the impurity; and the higher the impurity density is, the higher a diffusion coefficient becomes. The same phenomenon is also seen in the resistor doped with impurity into poly-silicon. As shown in FIG. 5, the resistance change ratio in the resistor samples having the impurity density lower than $1.0 \times 10^{20}/cm^3$ is very low (almost zero) and constant irrespective of the impurity density. As shown in FIG. 1, the resistance change ratio according to lapsed time is low when the resistor is kept at a low temperature. This may be explained from the fact that the re-diffusion of the impurity is not active at a low temperature.

It is concluded from the test results mentioned above that the resistance change in the resistor formed by doping the impurity into single crystal silicon is suppressed to a low level in a wide temperature range by making the impurity density lower than $1.0 \times 10^{20}/cm^3$, and that the resistance of the resistor are kept unchanged for a long time.

It is also important for a resistor detecting temperature that a temperature coefficient of resistance (TCR) is reasonably high. As shown in FIG. 6, TCR can be made high (higher than 2000 ppm/° C.) if the impurity density is within a range from $4.0 \times 10^{19}/cm^3$ to $1.0 \times 10^{20}/cm^3$. In addition, TCR can be made substantially constant in this range of the impurity density. Therefore, it is concluded that the temperature coefficient of the resistor can be made high while suppressing resistance change ratio by setting the impurity density in the range mentioned above.

In the first embodiment described above, the heater elements 131, 132, the temperature sensitive elements 133, 134 and the connecting portions 135 are formed, taking into consideration the test results described above. That is, the impurity density doped into single crystal silicon is set to a range from $7.0 \times 10^{19}/cm^3$ to $1.0 \times 10^{20}/cm^3$. Accordingly, the resistance change by aging in a wide range of temperature including a temperature range higher than 310° C. is suppressed to a low level. Since the re-diffusion is not active in a low temperature range and therefore resistance change is low, the effects of the present invention are especially notable in a high temperature range including a range higher than 310° C. Since the temperature coefficient of resistance is made high according to the present invention, temperature sensitivity can be made high, while suppressing deviation in the temperature coefficient of resistance.

In addition, since foreign particles adhering to the surface of the protecting layer 150 are effectively removed by using the detector at a high temperature (e.g., higher than 310° C.). A conventional detector cannot be used at a high temperature because its resistance change by aging at a high temperature is high. Accordingly, it has been difficult to remove foreign particles adhering to the surface of the conventional detector.

Figure 7A:
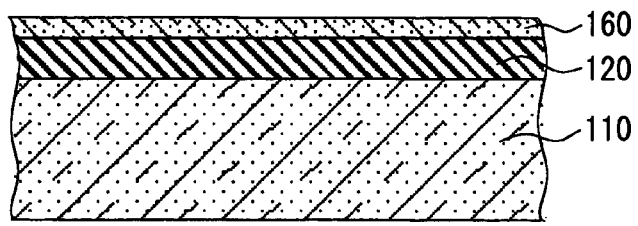
FIGS. 7A-7E are cross-sectional views showing a process of manufacturing the resistor formed by doping impurity into semiconductor layer.

Now, a manufacturing method of the semiconductor device 100 will be described with reference to FIGS. 7A-7E which show the cross-sectional views corresponding to that shown in FIG. 3. First, an SOI (Silicon On Insulator) substrate shown in FIG. 7A is prepared. The SOI is composed of: a semiconductor substrate 110 made of single crystal silicon having a thickness of about 600 μm; an insulating layer 120 made of silicon oxides having a thickness thicker than 0.01 μm (e.g., about 1 μm), laminated on the semiconductor substrate 110; and a single crystal silicon film 160 having a thickness of about 0.2-2 μm, laminated on the insulating layer 120.

Figure 7B:
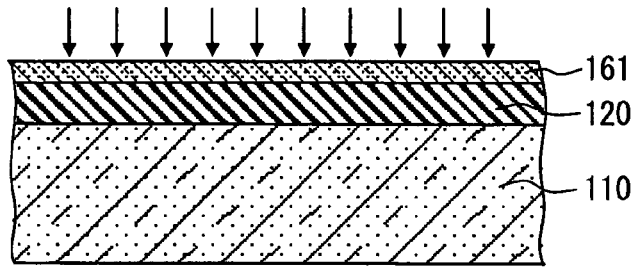

Then, as shown in FIG. 7B, a resistor layer 161 having a desired resistance is formed by doping phosphorus into the single crystal silicon film 160. The phosphorus is doped by injecting phosphorus ion into the single crystal silicon film 160, so that the impurity density (phosphorus density) falls in a range from $7.0 \times 10^{19}/cm^3$ to $1.0 \times 10^{20}/cm^3$. Preferably, the resistor layer 161 is annealed thereby to diffuse and to electrically activate phosphorus therein. The annealing is performed, for example, for two hours at 1,000° C.

Figure 7C:
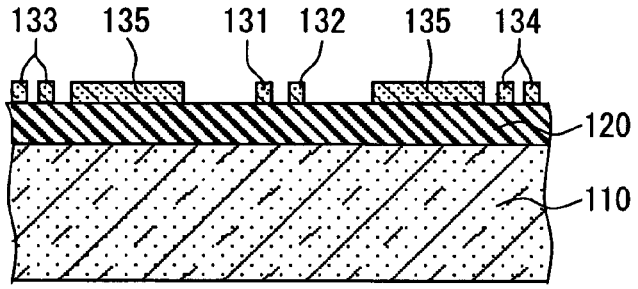

Then, as shown in FIG. 7C, the heater elements 131, 132, the temperature-sensitive elements 133, 134, and the connecting portions 135 are formed in the resistor layer 161 by activated ion etching. In this process, both of the upstream heater element 131 and the downstream heater element 132 are formed at the same time. Therefore, both heater elements 131, 132 are easily made to have the same resistance and the same temperature coefficient of resistance. Similarly, both of the upstream temperature-sensitive element 133 and the downstream temperature-sensitive element 134 are formed at the same time. Therefore, both are easily made to have the same resistance and the same temperature coefficient of resistance.

Figure 7D:
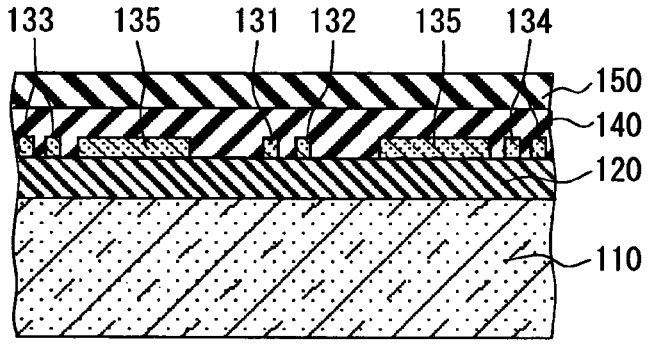

Then, as shown in FIG. 7D, an insulating layer 140 covering the heater elements 131, 132, the temperature-sensitive elements 133, 134, and the connecting portions 135 is formed by a plasma CVD method. The insulating layer 140 is made of silicon oxides, for example. A protecting layer 150 made of a silicon nitride film is laminated on the insulating layer 140 by a low pressure CVD method, for example. Then, contact holes (not shown) are formed through the protecting layer 150 and the insulating layer 140, and the pads 136 substantially made of aluminum are formed at the ends of the connecting portions 135 as shown in FIG. 2. The insulating layer 140 and the protecting layer 150 may be made of materials other than those mentioned above, and they may be made as multi-layers. The pads 136 may be made before the protecting layer 150 is formed when desired or the manufacturing process so requires.

Figure 7E:
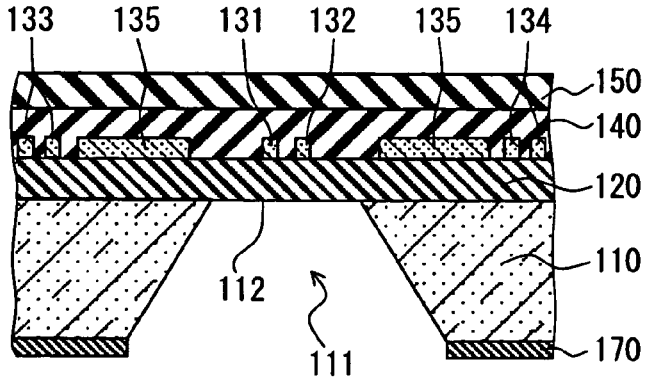

Then, as shown in FIG. 7E, the cavity 111 having the bottom opening 113 and reaching the bottom surface 112 of the insulating layer 120 (refer to FIG. 3) is formed in the semiconductor substrate 110. First in this process, a masking film made of e.g., silicon nitride is formed on the lower surface of the semiconductor substrate 110. A square area corresponding to the bottom opening 113 is removed from the masking film by e.g., activated ion etching to thereby form a mask 170. Then, anisotropic etching by alkaline solution such as KOH or TMAH is performed using the mask 170. Thus, the cavity 111 having a shape as shown in FIG. 7E is formed. By forming the cavity 111, a thin membrane portion, on which the heater elements 131, 132 are positioned, is formed. The etching of the cavity 111 is not limited to the wet etching but it may be etched by dry etching. After the cavity 111 is formed, the SOI substrate is separated into individual detector chips each corresponding to the semiconductor device 100. The semiconductor device 100 is electrically connected to a circuit processing signals through the pads 136.

Though the impurity density is set in a range from $7.0 \times 10^{19}/cm^3$ to $1.0 \times 10^{20}/cm^3$ in the foregoing embodiment, the impurity density is not limited to this range. It may be in a range from $4.0 \times 10^{19}/cm^3$ to $1.0 \times 10^{20}/cm^3$ to attain intended advantages of the present invention. The range from $7.0 \times 10^{19}/cm^3$ to $1.0 \times 10^{20}/cm^3$ is the most preferable range. In case a poly silicon film is used for forming the resistor element, and the impurity density is made higher than $2.0 \times 10^{20}/cm^3$, the temperature coefficient of resistance is increased by annealing after doping the impurity because the particle size of the poly silicon becomes large and becomes closer to that of the single crystal silicon. In the present invention, however, the single crystal silicon is used to form the resistor elements, the temperature coefficient of resistance can be made sufficiently high even if the impurity density is made lower than $1.0 \times 10^{20}/cm^3$ in order to suppress the resistance change by aging.

Though the resistor layer 161 shown in FIG. 7B is formed by doping phosphorus ion into the single crystal silicon film 160, phosphorus or other impurities may be doped by other methods such as a heat dispersion method (using gas or a solid phosphorus). Alternatively, the impurity may be doped directly to the SOI substrate. Phosphorus is used as the impurity in the foregoing process because an atom radius of the phosphorus is close to that of silicon and crystal defects are suppressed even the ion injection method is used. Further, the impurity density can be easily made uniform in the depth direction because a diffusion coefficient of phosphorus is high. However, the impurity is not limited to phosphorus, but other materials such as an N-type impurity or a P-type impurity including inexpensive boron may be used. Though the single crystal silicon film 160 formed on the SOI is used as a base film to form resistor elements in the foregoing embodiment, it is also possible to use other substrates such as a SIMOX (Silicon Implanted Oxide) substrate. In the case of SIMOX, a thickness deviation of the single crystal silicon film can be made smaller than that of the SOI substrate, thereby suppressing a deviation of the temperature coefficient of resistance.

In the first embodiment described above, phosphorus is used as the impurity to be doped into the single crystal silicon film. However, materials having a diffusion coefficient lower than that of phosphorus may be used as impurity. It is generally known that a level of the diffusion coefficient of N-type impurity is in the following order: phosphorus (P)>antimony (Sb)>arsenic (As)>bismuth (Bi). A resistor sample is made by doping arsenic (As) into a single crystal silicon film with a density of $7\times10^{19}/cm^3$. For comparison purpose, another resistor sample is made by doping phosphorus (P) with the same density into the single crystal silicon film. The resistance change ratio by aging is measured for both samples after keeping the samples at 310° C. for 500 hours.

Figure 8:
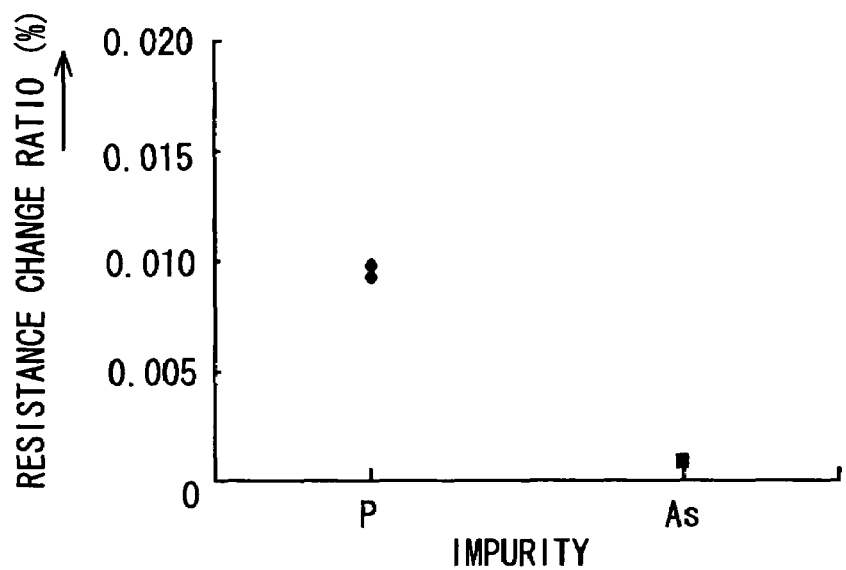
FIG. 8 is a graph showing the resistance change ratio in the resistor made by doping phosphorus or arsenic.

FIG. 8 shows the test results for both samples. It is seen from the graph that the resistance change ratio by aging is smaller in the arsenic-doped sample than that in the phosphorus-doped sample. This is because the diffusion coefficient of the arsenic is smaller than that of the phosphorus. This means that the resistance change ratio by aging at a high temperature (310° C.) can be made low by using a material having a lower diffusion coefficient as the dopant. Since the resistance change ratio at a low temperature is low, the resistance change ratio by aging can be made low in a wide temperature range by using a material having a low diffusion coefficient as the dopant. Further, when the arsenic is doped with the density of $1\times10^{20}/cm^3$ as in the first embodiment, the resistance change ratio by aging can be made lower than that of the phosphorus-doped resistor.

The relation between the diffusion coefficient and the resistance change by aging is described above as to the N-type impurity. The same is applicable to the P-type impurity. It is generally known that the diffusion coefficient of the P-type impurity is in the following order: aluminum (Al)>boron (B)>gallium (Ga)>indium (In). Since aluminum cannot be doped by the ion injection method, boron or an impurity element having the diffusion coefficient lower than that of boron is advantageously used as a dopant for forming the resistor element that has a lower resistance change ratio by aging.

Figure 9:
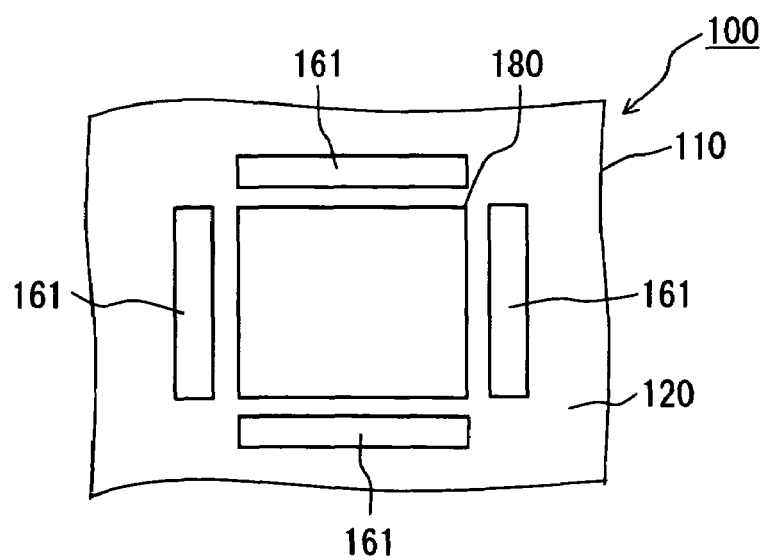
FIG. 9 is a schematic plan view showing a semiconductor device as a second embodiment of the present invention.

A second embodiment of the present invention will be described with reference to FIG. 9. In this embodiment, the resistor elements 161 formed in the method described in the first embodiment are disposed around a detector element 180. The detector element 180 for detecting a physical amount such as acceleration is disposed on an insulating layer 120 which is formed on a semiconductor substrate 110. The resistor elements 161 are formed by doping impurity into a single crystal silicon film formed on the semiconductor substrate 110. The impurity density is set in a range from $7\times10^{19}/cm^3$ to $1\times10^{20}/cm^3$, which is the same as that in the first embodiment. The resistor elements disposed around the detector element 180 function as heaters for keeping temperature of the detector element 180 constant.

Since the resistance change ratio by aging in the resistor elements 161 is suppressed to a low level in the same manner as in the first embodiment, the detector element 180 can be kept at a constant temperature to thereby stabilize outputs of the detector element in a wide temperature range. Though, in the example shown in FIG. 9, the resistor elements 161 are positioned around the detector element 180, their position is not limited to this position. For example, the resistor elements 161 may be laminated on the detector element 180 with an insulation layer interposed therebetween.

The present invention is not limited to the embodiments described above, but it may be variously modified. For example, though the substrate 110 made of silicon is used in the foregoing embodiments, it is possible to use other substrates such as a glass substrate. The resistor elements formed by doping impurity into the single crystal silicon film are used as a detector element or elements for maintaining temperature in the foregoing embodiments. The resistor elements formed according to the present invention can be widely used in various devices, such as an acceleration sensor, a temperature sensor or a humidity sensor.

While the present invention has been shown and described with reference to the foregoing preferred embodiments, it will be apparent to those skilled in the art that changes in form and detail may be made therein without departing from the scope of the invention as defined in the appended claims.

The invention claimed is:

1. A method of manufacturing a semiconductor device, comprising:
   forming a single crystal silicon film on a substrate via an insulation film;
   doping impurity into the single crystal silicon film, thereby forming a resistor element,
   annealing the single crystal film to diffuse the impurity in the single crystal silicon film so that an impurity density is uniform in the single crystal silicon film,
   wherein the impurity density doped into the single crystal silicon is lower than $1\times10^{20}/cm^3$ and higher than $4\times10^{19}/cm^3$, and
   wherein the impurity is phosphorus.

2. The method of manufacturing a semiconductor device as in claim 1, wherein the impurity density is higher than $7\times10^{19}/cm^3$.

3. The method of manufacturing a semiconductor device as in claim 1, wherein the impurity is N-type impurity having a diffusion coefficient lower than that of phosphorus.

4. The method of manufacturing a semiconductor device as in claim 1, wherein the impurity is boron.

5. The method of manufacturing a semiconductor device as in claim 1, wherein the impurity is P-type impurity having a diffusion coefficient lower than that of boron.

6. A semiconductor device manufactured according to the process of claim 1, wherein the resistor element has an operation temperature higher than 310° C.

7. The method of manufacturing a semiconductor device as in claim 1, wherein at least one part of the resistor element functions as a detector element for detecting a physical amount.

8. The method of manufacturing a semiconductor device as in claim 7, wherein the physical amount is a flow amount of fluid, and the other part of the resistor element functions as a temperature sensor for detecting temperature around the part of the resistor element functioning as the detector element.

9. The method of manufacturing a semiconductor device as in claim 1, further comprising: forming a detector element for detecting a physical amount on the single crystal silicon film in the vicinity of the resistor element.

10. The method of manufacturing a semiconductor device as in claim 8, further comprising:
    patterning the resistor element so that the detector element and the temperature sensor are formed.

11. The method of manufacturing a semiconductor device as in claim 1,
    wherein the annealing the single crystal silicon film is performed at 1000° C. for two hours.

* * * * *